United States Patent [19]
Kobayashi

[11] 4,198,692
[45] Apr. 15, 1980

[54] SELF-BIASED STRUCTURE FOR MAGNETIC BUBBLE DOMAIN DEVICES

[75] Inventor: Tsutomu Kobayashi, Placentia, Calif.

[73] Assignee: Rockwell International Corporation, El Segundo, Calif.

[21] Appl. No.: 945,148

[22] Filed: Sep. 22, 1978

[51] Int. Cl.² ............................................. G11C 19/08
[52] U.S. Cl. ........................................ 365/27; 365/32
[58] Field of Search ............................... 365/27, 28, 32

[56] References Cited

U.S. PATENT DOCUMENTS

| 3,836,898 | 9/1974 | Bobeck et al. | 365/32 |
| 3,996,571 | 12/1976 | Chang | 365/32 |
| 4,059,828 | 11/1977 | Kobayashi et al. | 365/27 |

*Primary Examiner*—James W. Moffitt
*Attorney, Agent, or Firm*—H. Fredrick Hamann; Richard A. Bachand; Daniel R. McGlynn

[57] ABSTRACT

There is provided a self-biased structure which permits magnetic bubble domain device operation. The invention consists of three layers of material with a bias layer sandwiched between two bubble layers.

14 Claims, 5 Drawing Figures

SELF-BIASED STRUCTURE FOR MAGNETIC BUBBLE DOMAIN DEVICES

BACKGROUND OF THE INVENTION

1. Field of the Invention

This invention is directed to magnetic bubble domain devices, in general, and to a particular self-biased structure, in particular.

2. Prior Art

Magnetic bubble domain devices are becoming well known in the art. Conventional magnetic bubble domain devices require an external bias field to stabilize the bubble domains in the devices. The external bias field is usually supplied by a structure composed of permanent magnets and soft magnetic material. However, the external bias structure takes up a large amount of volume and weight in a magnetic bubble domain memory package. Thus, in various applications where package volume and weight must be minimized, the necessity of the external bias structure poses a hindrance.

Various approaches have been proposed to "internally" supply a bias field thereby eliminating the external bias structure. Two approaches are described in U.S. Pat. No. 3,529,303 and U.S. Pat. No. 3,714,640 to Bobeck. In essence, an effective bias field is supplied internally by a 180° capping domain wall formed at the interface between a bubble domain film and a permanently magnetized layer which is exchange-coupled to the bubble film.

Epitaxially-grown self-biased structures were demonstrated by Uchishiba et al in a series of articles published in IEEE Transactions on Magnetics (Vol. MAG-9, pp. 381–385, 1973, Vol. MAG-10, pp. 480–483, 1974 and Vol. MAG-11, pp. 1079, 1081, 1975).

Although they have demonstrated with this structure a full device operation without an external bias field, a problem arises from the particular range of h/l, the normalized thickness of the bubble layer, required for full self-biasing. Namely, the above range of h/l falls below the preferred range used in most device applications.

A few suggestions have been made in the prior art for achieving a self-biased structure having h/l in the preferred range. U.S. Pat. No. 3,968,481 by Grundy and Lin suggests conditions under which h/l of the bubble layer can be brought into the preferred range. However, this teaching requires the assumption that the capping domain wall is formed in the bias layer if its l is greater than that of the bubble layer. The validity of this assumption is highly suspect. In fact, rigorous theoretical considerations and experimental evidence indicate that the capping domain wall formed as such is unstable.

Another approach has been suggested by Kobayashi et al (U.S. Pat. No. 4,059,828). In this approach, another (second) bias layer was added on top of the bubble layer. In this structure, the effective bias field is doubled.

SUMMARY OF THE INVENTION

The self-biased structure of the present invention consists of three layers wherein one bias layer is sandwiched between two bubble domain layers. The bias layer has an extremely high anisotropy field and its wall energy is higher than that of the bias layers. Capping walls are formed above and below the bias layer so that the bubbles in each of bubble layers are biased. Since the bias layer is permanently magnetized perpendicular to its plane, the permeability thereof is not appreciably different from that of a vacuum. Inasmuch as the capping walls on each side of the bias layer do not extend into the bias layer, there is no exchange coupling between the bubbles in the separate bubble layers. Thus, the interaction between the top layer and bottom layer bubbles is basically magnetostatic. Therefore, if the thickness of the bias layer ($h_b$) is small compared to that of the bubble layers combined, i.e., $h_b << h_1 + h_2$, the bubbles in the respective layers are strongly coupled to form a double bubble. The resulting double bubble behaves much like a single bubble of height slightly less than $h_1 + h_2$.

DESCRIPTION OF A PREFERRED EMBODIMENT

Figure 1:
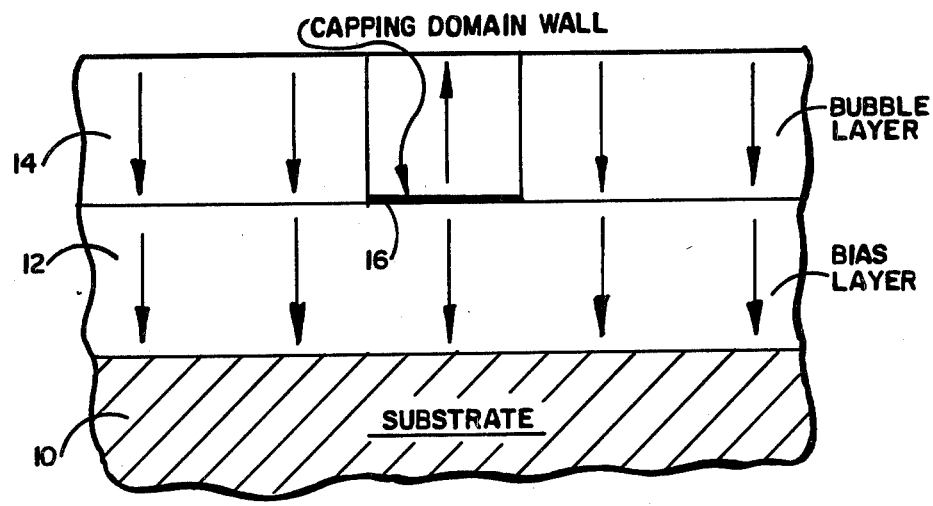
FIGS. 1 and 2 are schematic representations of prior art structures.

FIG. 1 illustrates a prior art structure which consists of a biasing layer 12 formed on a suitable support substrate 10. Bubble layer 14 is formed on top of biasing layer 12. Layers 12 and 14 can be formed in any suitable manner such as LPE, CVD or the like. However, biasing layer 12 is defined as having an extremely high uniaxial anisotropy field. Also, bubble layer 14 is defined as having a domain wall energy smaller than that of biasing layer 12.

Figure 5:
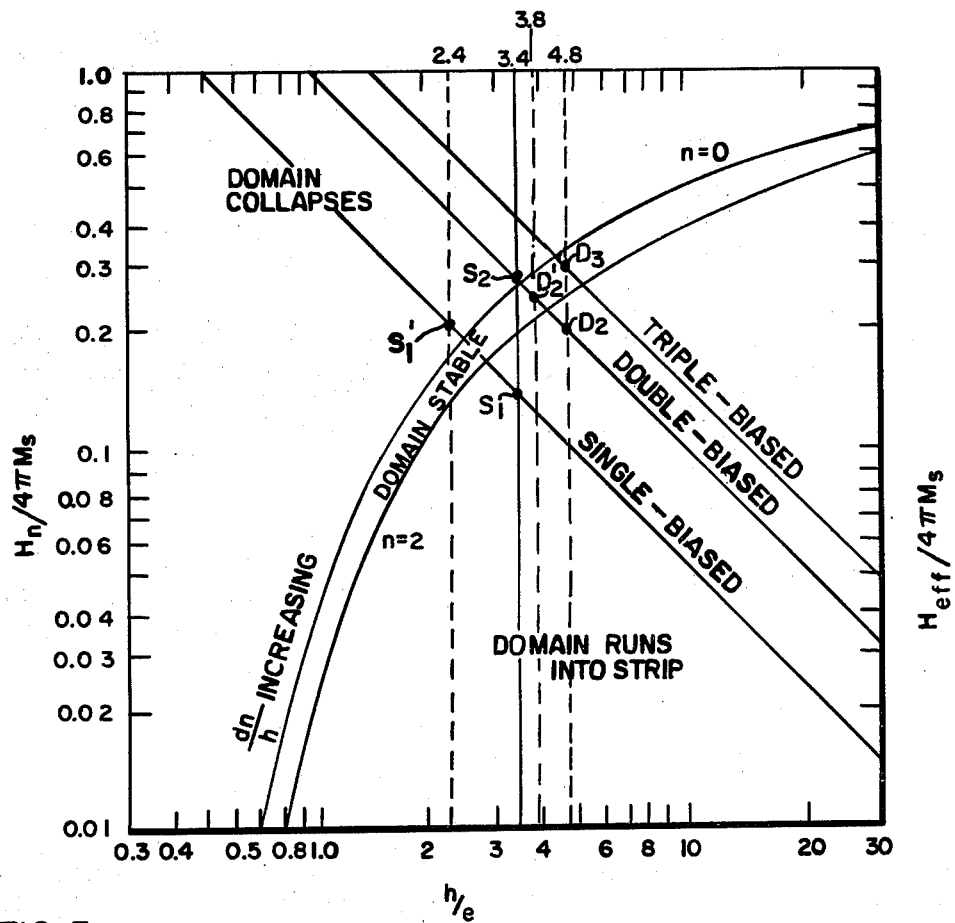
FIG. 5 is a graph which shows the effective bias field and the bubble stabilized range as a function of the effective thickness to the effective material characteristic length, h/l, for bubble domain structures.

In this structure capping domain wall 16 is formed in bubble layer 14 and it has been shown that the effective bias field, $H_{eff}$, can be closely represented by the expression $$\frac{H_{eff}}{4\mu M_s} = \frac{1}{2} - \frac{1}{(h/l)} \quad (1)$$

where $M_s$, h, and l are, respectively, the saturation magnetization, thickness, characteristic length of bubble layer 14. Also, it is shown that $H_{eff}$ is independent of the properties of bias layer 12. Equation (1) is plotted in the graph shown in FIG. 5 as a function of h/l, the normalized thickness of the bubble layer, together with the bubble stability range. The line labeled "SINGLE-BIASED" represents Eq. (1). In FIG. 5, $H_0(H_n;n=0)$ and $H_2(H_n;n=2)$ denote the collapse field and the run-out field of the bubble, respectively. It can be seen from this diagram that the normalized thickness, h/l, must be tuned to 2.75±0.25 to achieve full self-biasing.

Although the structure of FIG. 1 appears to demonstrate full device operation without an external bias field, the above-noted range of h/l falls below the preferred range used in most device applications which is ∼3.3 or higher. The value ∼3.3 is preferred because the highest packing density attainable generally occurs at h/l≈3.3 for a given value of l as described by Thiele, "Device Implications of the Theory of Cylindrical Magnetic Domains", Bell System Tech. J. Vol. 50, pp. 725–773, (esp. 741 and 742), 1971. A slightly higher value of h/l is often used to allow higher bubble height and, therefore, a stronger bubble stray field for the purpose of achieving stronger coupling of the bubble with the device.

Figure 2:
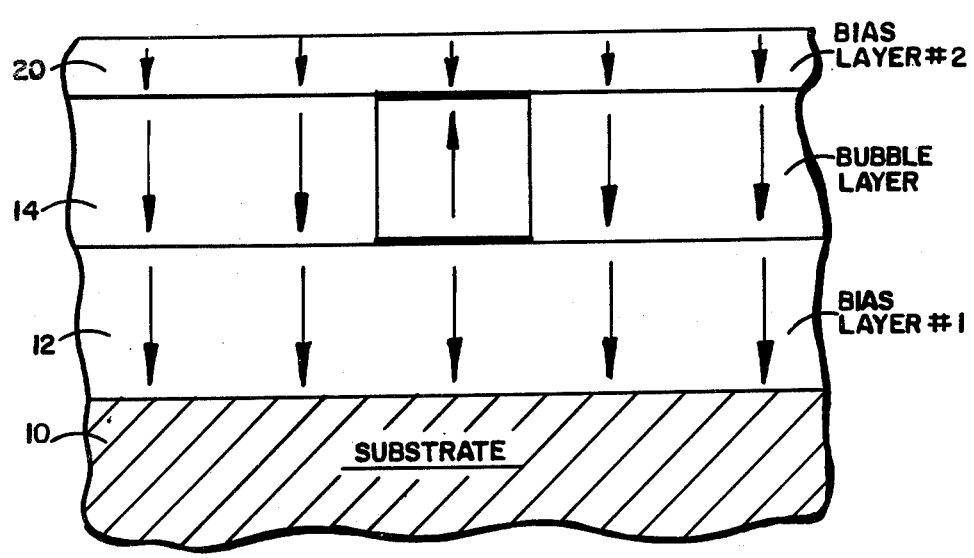

Referring now to FIG. 2, there is shown another illustration of a self-biased structure known in the prior art. This self-biased structure is of the type previously described by Kobayashi et al in U.S. Pat. No. 4,059,828. In this embodiment, the third layer is provided. The third layer is a further bias layer 20 which is deposited on top of bubble layer 14. Again, layer 20 can be formed in any suitable or desirable manner such as LPE, CVD or the like. Also, capping domain walls 16 and 18 are both formed in bubble layer 14. In this structure, the effective bias field is doubled as suggested by Equation 2.

$$H_{eff}/4 \mu M_s = 1/(h/l) \tag{2}$$

This relation is also plotted in FIG. 5 as the solid line labeled "DOUBLE-BIASED". It is seen from FIG. 5 that the range of h/l for full self-biasing is 3.8±0.4, which is just in the preferred range. Because the thickness of layer 20 (as well as that of layer 12) is more or less arbitrary as long as it is on the order of or greater than the width of the capping wall, it can be made small enough to be compatible with device requirements such as the spacing between layer 14 and the propagation means to be fabricated on layer 20. Nevertheless, in certain applications where the spacing should be very small, such a layer is definitely undesirable. Besides, it is known that mechanical damage on the bias layer, no matter how small, lowers the domain nucleation field, making the structure more susceptible to demagnetization. Thus, a need arises for a self-biased structure which is more compatible with device requirements.

Figure 3:
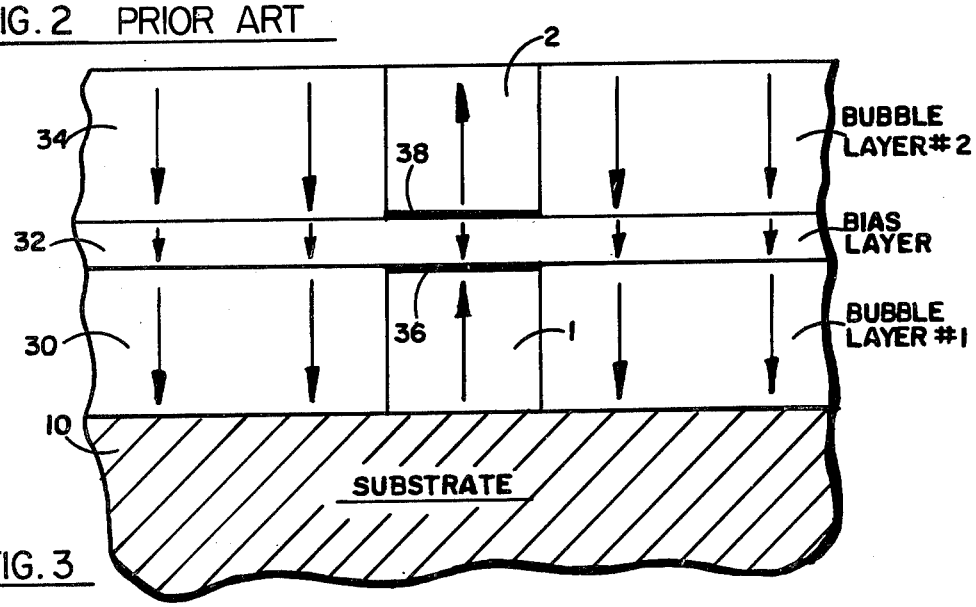
FIGS. 3 and 4 are schematic representations of structures formed in accordance with the instant invention.

Referring now to FIG. 3, there is shown an improved structure in accordance with the instant invention. In this structure, bubble layer 30 is formed on substrate 10 in a suitable fashion. Bias layer 32 is formed on top of layer 30. A further bubble layer 34 is formed on top of bias layer 32. In this case, bubbles 1 and 2 are formed in bubble layers 30 and 34, respectively. Likewise, capping domain walls 36 and 38 are formed at bubbles 1 and 2, respectively and in bubble layers 30 and 34, respectively.

The self-biased structure of the present invention, as shown in FIG. 3, offers a better solution to the problems discussed above. It can also be utilized for a double-bubble coded lattice film device similar to the one which has been proposed by Kobayashi et al in U.S. Pat. No. 4,059,828. For instance, consider that layers 30 and 34 are made of the same material (which is of course not required) and, therefore, their characteristic lengths $l_1$ and $l_2$ are equal. Then, for the parameter values $$l_1 = l_2 \approx 0.5 \ \mu m$$

$$h_b \approx 0.3 \ \mu m$$

$$h_1 + h_2 \approx 2.5 \ \mu m$$

the double bubble behaves like a single bubble of thickness $h \approx 1.9 \ \mu m$ and median diameter $d \approx 4 \ \mu m$.

Now, note that this double bubble is "double-biased" since it has two capping walls 36 and 38. Therefore, it is equivalent to a single bubble of thickness slightly smaller than $h_1 + h_2$ having a bias layer on top and at the bottom as illustrated in FIG. 2. For the above example the equivalent h/l is about 3.8, which is right in the middle of the stability range for the double-biased case as seen from FIG. 5. Thus, the present invention provides a self-biased structure having equivalent h/l in the preferred range.

Figure 4:
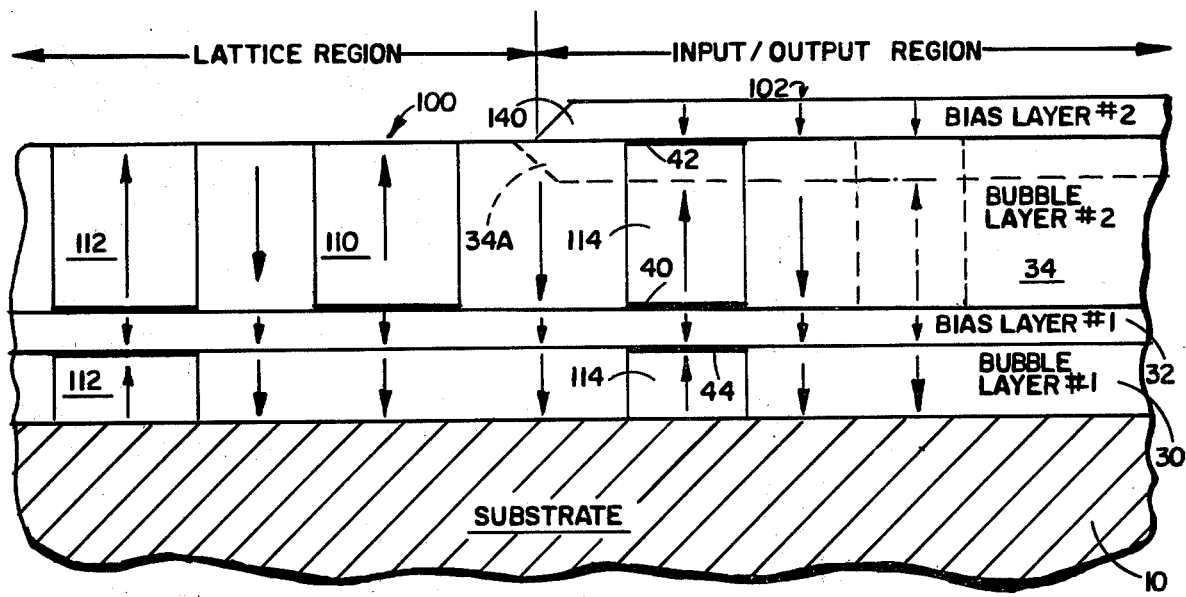

Referring now to FIG. 4, it can be seen that the structure of the present invention can also be utilized for double bubble coded lattice file devices described in the U.S. Pat. No. 4,059,828 by Kobayashi et al. A bubble lattice file device consists of two regions, viz. the storage or lattice region 100 and the input/output region 102. The structure for lattice region 100 is basically the same as that of FIG. 3 except for the material parameter values. The parameter values for the lattice region are chosen such that single bubbles such as bubble 110 in layer 34 and double bubbles such as bubble 112 and 114 coexist. In addition, the double and single bubbles exhibit the same diameter when closely packed in a mixture at a certain packing density without an external bias field. Note also that the double bubble is double-biased and the single bubble single-biased. For example, $h_2/l_2$ for single bubble 110 is $\sim 3.4$ (point $S_1$ in FIG. 5). The equivalent of h/l for the double bubble 112 is $\sim 4.8$ (point $D_2$ in FIG. 5). These bubbles form a uniform lattice. It should be noted that points $S_1$ and $D_2$ in FIG. 5 fall in the strip-out region for an isolated bubble. However, bubble-bubble interactions prevent strip-out in the lattice configuration. Thus, binary information can be represented by the presence or absence of a bubble in layer 30. Of course, the former corresponds to a double bubble and the latter to a single bubble in conjunction with bubble layer 34.

In input/output region 102, it is desirable to utilize conventional input/output techniques in which binary information is represented by the presence or "total absence" of a bubble. To realize this, the structure can be modified in one of two ways. In one method, an additional bias layer 140 is placed on top of bubble layer 34 in the input/output region. Then, the single bubble is double-biased and the double bubble is triple-biased. That is, a single bubble such as the upper bubble 114 has capping domain walls 40 and 42 to be double biased. Conversely, a double bubble such as the upper and lower bubbles 114 includes capping domain walls 40, 42 and 44 to be triple biased. In the diagram of FIG. 5, therefore, point $S_1$ is moved up to point $S_2$ into the collapse region and point $D_2$ is moved up to point $D_3$ into the fully self-biased region. Thus, a double bubble and a single bubble are converted into a bubble and no bubble, respectively, when they are carried into the input/output region from the lattice region.

The double bubble/single bubble-to-bubble/no bubble conversion can also be achieved by thinning layer 34 as shown by broken line 34A in FIG. 4. In this case, bias layer 140 is omitted. That is, if layer 34 is thinned down from $h_2/l \sim 3.4$ to $h_2'/l_2 \sim 2.4$, the equivalent h/l for the double-bubble is reduced from $h/l \sim 4.8$ to $h'/l \sim 3.8$ (see dashed lines in FIG. 5). Thus, points $S_1$, and $D_2$ slide up to $S_1'$ and $D_2'$, which are in the collapse and fully self-biased regions, respectively.

In summary, the present invention offers a self-biased structure which meets device requirements. It can also be used for a self-biased bubble lattice device with the added advantage that the lattice region can be directly interfaced with the input/output region which makes use of conventional input/output techniques. Those skilled in the art may conceive modifications to the structures shown and described. However, any such modifications which fall within the purview of the description are intended to be included herein as well. The description is intended to be illustrative only. The scope of the application is limited only by the claims appended hereto.

Having thus described a preferred embodiment of the invention, what is claimed is:

1. A self-biased structure for magnetic bubble domain devices comprising,
    first and second layers of magnetic bubble domain materials, and
    a magnetic biasing layer interposed between said first and second layers of magnetic bubble domain material.
2. The structure recited in claim 1 wherein all of said layers are magnetized in the same direction.
3. The structure recited in claim 1 wherein said biasing layer has a high anisotropy and a wall energy which is higher than the wall energy of either of said first and second layers.
4. The structure recited in claim 2 wherein all of said layers are magnetized perpendicular to the plane thereof.
5. The structure recited in claim 1 wherein said biasing layer is permanently magnetized perpendicular to the plane thereof.
6. The structure recited in claim 1 wherein said biasing layer is relatively thin compared to said first and second layers combined.
7. The structure recited in claim 1 including a further biasing layer disposed over a portion of one of said first and second layers.
8. The structure recited in claim 1 wherein one of said first and second layers is made thinner to alter the characteristics thereof.
9. The structure recited in claim 1 including a substrate for supporting said layers.
10. The structure recited in claim 1 wherein, said first and second layers of magnetic bubble domain materials support bubble domains having a median diameter of about 4 $\mu$m.
11. The structure recited in claim 7 wherein, said further biasing layer comprises an input/output region for interaction with other bubble domain circuits.
12. The structure recited in claim 1 wherein, said first and second layers exhibit parameters such that single bubble domains in the uppermost of said first and second layers and double bubbles in both said first and second layers can co-exist.
13. The structure recited in claim 1 wherein, said layers exhibit characteristics such that capping domain walls are formed by bubble domains within the respective bubble domain layer adjacent to said biasing layer.
14. The structure recited in claim 1 wherein, said first and second layers are constructed of the same type of material.

* * * * *